United States Patent [19]

Chang

[11] 3,784,424

[45] Jan. 8, 1974

[54] PROCESS FOR BORON CONTAINING GLASSES USEFUL WITH SEMICONDUCTOR DEVICES

[75] Inventor: Shao-Yuen S. Chang, Syracuse, N.Y.

[73] Assignee: General Electric Company, Syracuse, N.Y.

[22] Filed: Sept. 27, 1971

[21] Appl. No.: 184,093

[52] U.S. Cl. .......... 156/15, 156/17, 156/24, 252/79.3

[51] Int. Cl. .......... C03c 15/00, H01l 7/50

[58] Field of Search .......... 156/15, 24, 17; 252/79.3; 65/31

[56] References Cited

UNITED STATES PATENTS

| | | | |
|---|---|---|---|
| 1,772,965 | 8/1930 | Smith | 156/24 |
| 3,181,984 | 4/1965 | Tillis | 156/20 |
| 3,203,884 | 8/1965 | Gruss et al. | 204/140.5 |

*Primary Examiner*—William A. Powell
*Attorney*—Robert J. Mooney et al.

[57] ABSTRACT

A glass containing about 5 percent or more by weight boron oxide may be etched using fluoroboric acid as an etchant. The fluoroboric acid etchant is advantageously employed becuase of its comparatively low acidity. The boron oxide containing glass may be utilized as a boron diffusion source in the fabrication of semiconductor devices and may be covered by a barrier layer, such as phosphosilicate glass.

4 Claims, 5 Drawing Figures

PATENTED JAN 8 1974

3,784,424

Figure 1:
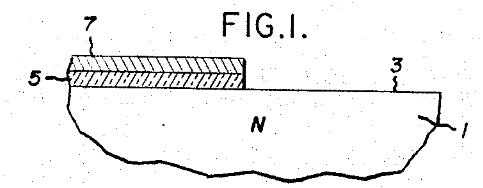

INVENTOR:
SHAO-YUEN S. CHANG,

BY Carl O. Thomas
HIS ATTORNEY.

PROCESS FOR BORON CONTAINING GLASSES USEFUL WITH SEMICONDUCTOR DEVICES

The invention relates to a process for etching a glass containing about 5 percent or more by weight boron oxide and, in a specific application, to a process useful in the fabrication of semiconductor devices.

Prior to this invention it has been known to those skilled in the art to utilize borosilicate glass as a passivant for semiconductor devices. It has also been recognized that borosilicate glass may be used as an impurity source material when deposited on the surface of a silicon semiconductive element. The boron from the glass in this instance acts as a P conductivity type dopant which may be used to create a P-N junction, where the boron is diffused into an adjacent N conductivity type region of the semiconductive element, or to create a more highly doped P+ region adjacent the surface of the semiconductive element that will form a juncture, where the underlying P conductivity type region is more lightly doped. With the glass utilized as a diffusion source as well as a surface passivant it is common practice to apply a glass layer, such as phosphosilicate glass, over the surface of the borosilicate glass. The phosphosilicate glass performs the dual functions of acting as a gettering material for impurities detrimental to the functioning of the semiconductive element and as a barrier to the diffusion of boron contained within the underlying glass layer.

In conventional practice when it is desired to remove the glass layers from an area of the semiconductive element for the purpose of permitting contact to the surface of the semiconductive element and/or metal contact layers associated therewith, any one of a variety of well known etchants may be utilized to remove the phosphosilicate glass. The borosilicate glass is, however, quite resistant to ordinary etchants and must be removed with hydrofluoric acid, used alone or in combination with other agents. For example, one well known etchant for borosilicate glass is comprised of a mixture of hydrofluoric and nitric acids. A disadvantage associated with these etchants for borosilicate glass is that their high acidity causes them to attack common photoresist materials used to define the areas on the surface of the semiconductor device to be etched. This lateral attack of the photo-resist materials causes the patterns being formed on the surface of the semiconductor device to lose considerable definition, particularly where the borosilicate glass is of substantial thickness.

It is an object of this invention to provide a process for etching a boron oxide containing glass.

It is a more specific object to provide a process for etching a boron oxide containing glass using an etchant which possesses a relatively low acidity and which as a result is capable of producing patterns of improved definition.

In one form the invention is directed to an etching process comprising providing a body of glass containing about 5 percent or more by weight boron oxide. Fluoroboric acid is applied to a surface portion of the glass body to etch away a portion thereof. The glass body may have an aperture etched therein. For example, the aperture may expose an underlying substrate, such as a metal substrate or a semiconductive element surface. The glass body may be heated to drive boron out of the glass body into an underlying semiconductive substrate. A barrier may be provided overlying the glass body so that loss of boron from the glass body, except by diffusion into the semiconductive substrate, is minimized. A phosphosilicate glass may be utilized as a barrier.

The invention may be better understood by reference to the following detailed description considered in conjunction with the drawings, in which FIGS. 1 through 5 inclusive are fragmentary sectional schematic views of a semiconductor device at various stages of processing. In the FIGS. the thicknesses of the elements are greatly exaggerated for ease of illustration, and sectioning is omitted from the semi-conductive element in order to avoid unduly cluttering the drawings.

This invention is based upon the discovery that when a glass contains about 5 percent or more by weight boron oxide it can be etched with fluoroboric acid. The fluoroboric acid is an improvement upon hydrofluoric acid and mixtures thereof previously utilized to etch boron oxide containing glass, since the fluoroboric acid possesses a much lower level of acidity than hydrofluoric acid etchants. For example, fluoroboric acid etchant as employed in the practice of this invention may have a pH of from 5.5 to 7, whereas hydrofluoric acid etchant compositions possessing comparable etch rate characteristics on boron oxide containing glasses typically exhibit a pH of 1 or 2 or less. The fluoroboric acid etchant is preferably employed as an aqueous solution. The proportions of acid and water are not critical and may be varied widely since the water functions merely a diluent for the acid.

In order to be effective as an etchant it is necessary that the fluoroboric acid be applied to a glass containing about 5 percent or more by weight boron oxide. Such glasses, particularly borosilicate glasses, have found use in the passivation and encapsulation of semiconductive elements. Typically the glasses utilized are formulated primarily of silicon, boron, and oxygen with one or more other metals, such as zinc, lead, cadmium, barium, etc., being also sometimes present in varying amounts. Glass compositions known to be useful with semiconductor elements and which contain at least 20 percent by weight boron oxide and are useful in connection with this invention are set forth in U. S. Pat. Nos. 3,505,571 and 3,113,878. In its simplest form the glass may consist essentially of boron, silicon and oxygen and conform to the empirical formula $SiO_2B_2O_3$. Except for the inclusion of boron oxide in a percentage of about 5 percent or more by weight, the composition of the glass is not critical to the practice of the invention.

It has been recognized in connection with this invention that fluoroboric acid attacks glass compositions containing at least about 20 percent by weight boron oxide at a high etch rate. In etching glass compositions containing boron oxide in the range of from 5 percent to 20 percent by weight the rate of etching declines disproportionately with decline in the boron oxide content, so that any very slight decrease in the boron oxide composition of a glass below about 5 percent by weight drops very dramatically the rate at which it is attached by fluoroboric acid. From the foregoing it is apparent that in order to achieve a very high etch rate using fluoroboric acid it is desirable to utilize a glass containing about 20 percent by weight or more boron oxide. In no instance should the glass composition be chosen to be below about 5 percent by weight. Accordingly, in applications where loss of boron is contemplated prior to etching, such as in using the boron oxide containing glass as a boron diffusion source, it is desirable to maintain the boron oxide content of the glass sufficiently above about 5 percent by weight that it does not fall below this level after diffusion and before etching.

A preferred form of my invention may be best described by reference to the specific application illustrated in the drawings. As shown in FIG. 1 a semiconductive element 1 of N conductivity type, at least in the area shown, is provided with a surface 3. The semiconductive element is preferably comprised of monocrystalline silicon. A dielectric layer 5 covers a portion of the semiconductive element surface. The dielectric layer may be silicon dioxide, a glass dielectric passivant, or a combination of known dielectric layers, such as a silicon dioxide layer covered by a silicon nitride layer. Overlying the dielectric layer is a conductive layer 7. The conductive layer may be formed of one or more layers of conventional semiconductor contact metals. In one form the conductive layer may be the gate electrode of a metal oxide semiconductor field effect transistor (MOSFET). In this form the conductive layer may be conveniently formed of polycrystalline silicon or a refractory metal, such as molybdenum. In another form the conductive layer may be provided for the purpose of providing an ohmic interconnection of areally separated points on the surface of the semiconductive element.

Figure 2:
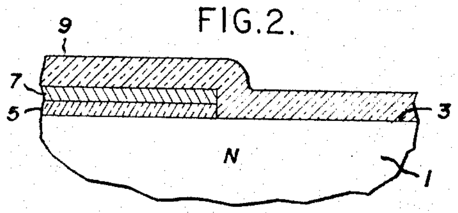

As shwon in FIG. 2 a boron oxide containing glass layer 9 is then deposited so that it overlies the conductive layer 7 and the adjacent exposed surface of the semiconductive element. The glass layer contains at least about 5 percent or more (and most preferably about 20 percent or more) by weight boron oxide at the time it is deposited, since it is intended that the glass be utilized as a diffusion source for boron. To prevent escape of boron from the glass layer 9 to the ambient atmosphere during diffusion a barrier layer 11 is deposited over the first glass layer. In the preferred form of the invention the barrier layer is comprised of phosphosilicate glass. The phosphosilicate glass is particularly advantageous to utilize as a barrier layer, since it acts both as a barrier to the out-diffusion of boron and as a gettering agent for impurities that might occur at or near the surface of the semiconductive element. As is known to those skilled in the art, in order to drive boron from the glass layer 9 into the semiconductive element it is necessary to heat the semiconductive element and the glass layers to a temperature in the vicinity of about 1,000°C.

Figure 3:
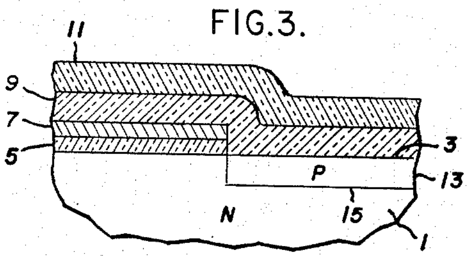

As shown in FIG. 3 this drives boron into the surface of the semiconductive element to form the P conductivity type region 13 and a junction 15 between the P and N conductivity type regions. In the preferred form of the invention the conductive layer 7 is chosen so that it prevents boron diffusion into the surface of the semiconductive element. For example, it is conventional practice to form MOSFET structures with refractory metal gates, such as molybdenum gates, which are self-registered by reason of their ability to define the areas within which source and drain regions may be diffused into the semi-conductive element. In a similar manner the gate metal can be utilized to limit the area of the P conductivity type region 13. In the specific application illustrated the region 13 is laterally remote from any source or drain region that may be formed on the surface of the semiconductive element. It is, of course, recognized that the source and drain regions for a MOSFET application could be formed simultaneously with forming the region 13.

Figure 4:
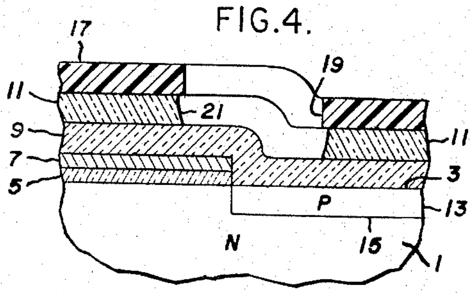

As shown in FIG. 4 the next step of the process is to deposit an etch resistant layer 17 over the glass layer 9. The etch resistant layer may take any one of a variety of well known conventional forms and is preferably formed of a photo-resist material of a type commonly used to form masks on the surfaces of semiconductor elements. By selective photo exposure the etch resistant layer may be formed to define an aperture 19 overlying a portion of the conductive layer and the semiconductive element surface laterally adjacent thereto. A conventional etchant for phosphosilicate glass may then be applied within the aperture 19 to form a corresponding aperture 21 in the barrier layer 11.

Figure 5:
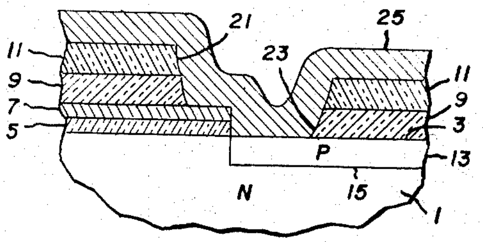

Referring next to FIG. 5, in order to form the aperture 23 in the boron oxide glass layer 9 it is merely necessary to introduce fluoroboric acid through the apertures 19 and 21 previously formed. In a typical application many thousands of apertures may be formed in one or more boron oxide glass layers overlying a single semiconductive element. At the same time the semiconductive element may be integrally related to a plurality of elements in a single semiconductive wafer. Typically the element or wafer containing the element is immersed in an aqueous solution of fluoroboric acid to allow simultaneous access to all points requiring etching. After the aperture 23 is formed by etching followed by rinsing and drying, a conventional semiconductor contact metal, such as aluminum, gold, silver, etc., may be deposited to form the layer 25. The layer 25 forms an ohmic contact between the surface of the P conductivity type region 13 and the conductive layer 7. This sort of a conductive bridge between a conductive layer and a surface area of a semiconductive element is conventionally referred to as a patch and is widely used for the purpose of making a connection between a conductive layer insulated from a semiconductive element surface portion and an adjacent area on the semiconductive element. One specific patch application is for the attachment of gate electrodes of MOSFET structures to other elements contained within a monolithic semiconductor integrated circuit chip.

It is recognized, of course, that the above description of the invention is directed to certain preferred applications and that the invention can be readily applied to still other applications. For example, while I have disclosed the formation of a P conductivity type region in an N conductivity type semiconductive substrate, it is appreciated that it is not essential to the use of my invention to diffuse boron into the surface of the semiconductive element. It is also specifically contemplated that boron may be diffused from the boron oxide glass containing layer into a P conductivity type semiconductive element portion so that a surface adjacent region is converted to P+ conductivity type. While in connection with the drawings I have discussed the possibility of connecting a conductive layer with the surface of a semiconductive element, it is appreciated that my invention may be utilized generally for the purpose of forming apertures in boron oxide containing glass layers overlying semiconductive element and conductor surfaces for the purpose of providing access. For example, an aperture could be formed according to my etching process for the sole purpose of providing an external connection to a MOSFET gate, source, or drain. Also, an aperture could be formed for the purpose of allowing ohmic contact to be made to anode or cathode of an integrated diode element portion or to the base, emitter, or collector of an integrated transistor element portion. Aside from monolithic integrated circuits my invention may be applied to the formation of discrete semiconductive elements where lead access to the element is required through a boron oxide containing glass. Also, my invention is useful in the hybrid integrated circuit arts in allowing interconnections to be formed between conductor layers that are to be formed at different levels using a boron oxide containing glass as an insulative medium therebetween. Still other applications will readily occur to those skilled in the art. Accordingly, it is intended that the scope of this invention be determined by reference to the following claims:

What is claimed and desired to be secured by Letters Patent of the United States is:

1. In the manufacture of semiconductor devices including a silicon semiconductor body on which is provided regions of silicon oxide and a body of glass containing at least about 5 percent by weight boron oxide, a process for etching the glass body in a region of predetermined shape defined by a superimposed patterned layer of resist, said process comprising applying to said region an aqueous solution of fluoroboric acid having a pH of from about 5.5 to 7.

2. An etching process according to claim 1 in which the glass body is formed as a continuous layer on a silicon semiconductor substrate and contains at least about 20 percent by weight boron oxide, and the substrate with the continuous layer thereon is heated to a temperature sufficient to drive a portion of the boron contained within the glass layer into the substrate prior to applying fluoroboric acid.

3. An etching process according to claim 1 including forming the glass body as a continuous layer on a silicon semiconductor substrate and to contain at least about 20 percent by weight boron oxide, providing a glass barrier layer comprised of phosphosilicate glass over at least a portion of the continuous layer to prevent outward diffusion of boron and to getter impurities, heating the substrate with the glass layers to a temperature sufficient to drive a portion of the boron contained within the continuous layer into the substrate, forming the resist layer to be substantially inert toward fluoroboric acid and to define an aperture over at least a portion of the barrier layer, removing that portion of the barrier layer that lies within an area defined by the aperture, and applying the fluoroboric acid to the continuous layer within the aperture to form a corresponding aperture within the continuous substrate.

4. A process for connecting a conductive layer which is supported upon an insulative layer to the surface of a semiconductive substrate comprising forming on an exposed surface of the conductive layer and a laterally adjacent surface of the semiconductive substrate a layer of a glass passivant containing at least about 5 percent by weight boron oxide, forming a layer overlying the glass passivant which is substantially inert to fluoroboric acid and which defines an aperture overlying both the conductive layer and the semiconductive substrate adjacent thereto, applying fluoroboric acid having a pH of from about 5.5 to 7 to the surface portion of the glass passivant layer defined by the aperture in an amount sufficient to permit formation of a corresponding aperture in the glass passivant layer exposing the conductive layer and the semiconductive substrate surface laterally adjacent thereto, and providing an electrically conductive interconnection within the aperture between the conductive layer and the semiconductive substrate surface portion adjacent thereto.

* * * * *